United States Patent
Kikuchi

(10) Patent No.: US 7,700,492 B2
(45) Date of Patent: Apr. 20, 2010

(54) PLASMA ETCHING METHOD AND APPARATUS, CONTROL PROGRAM AND COMPUTER-READABLE STORAGE MEDIUM STORING THE CONTROL PROGRAM

(75) Inventor: Akihiro Kikuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 245 days.

(21) Appl. No.: 11/472,379

(22) Filed: Jun. 22, 2006

(65) Prior Publication Data

US 2006/0289385 A1    Dec. 28, 2006

Related U.S. Application Data

(60) Provisional application No. 60/697,995, filed on Jul. 12, 2005.

(30) Foreign Application Priority Data

Jun. 22, 2005    (JP)    ................ 2005-182084

(51) Int. Cl.
*H01L 21/302*    (2006.01)
*H01L 21/461*    (2006.01)

(52) U.S. Cl. .................. 438/706; 438/714; 438/723
(58) Field of Classification Search .................. None
See application file for complete search history.

(56) References Cited

U.S. PATENT DOCUMENTS

| | | | | |
|---|---|---|---|---|
| 6,117,786 | A * | 9/2000 | Khajehnouri et al. | 438/700 |
| 6,211,092 | B1 * | 4/2001 | Tang et al. | 438/719 |
| 6,399,511 | B2 * | 6/2002 | Tang et al. | 438/714 |
| 6,458,516 | B1 * | 10/2002 | Ye et al. | 430/317 |
| 6,645,870 | B2 * | 11/2003 | Negishi et al. | 438/710 |
| 6,686,293 | B2 * | 2/2004 | Kim et al. | 438/711 |

* cited by examiner

*Primary Examiner*—Duy-Vu N Deo
(74) *Attorney, Agent, or Firm*—Oblon, Spivak, McClelland, Maier & Neustadt, L.L.P.

(57) ABSTRACT

A plasma etching method and apparatus, a control program and a computer-readable storage medium storing the control program are provided. The method is provided for performing a plasma etching on a silicon oxide film through an amorphous carbon mask, wherein the plasma etching is performed by using an etching gas containing a fluorocarbon gas, an oxygen gas, a helium gas and at least one of an argon gas, a krypton gas and a xenon gas.

4 Claims, 2 Drawing Sheets

PLASMA ETCHING METHOD AND APPARATUS, CONTROL PROGRAM AND COMPUTER-READABLE STORAGE MEDIUM STORING THE CONTROL PROGRAM

FIELD OF THE INVENTION

The present invention relates to a plasma etching method and apparatus for forming a hole in a silicon oxide film by performing an etching process using a mask, and a control program and a computer-readable storage medium storing the control program to be used therefor.

BACKGROUND OF THE INVENTION

Conventionally, in a manufacturing process for a semiconductor device, a hole such as a contact hole is formed in a silicon oxide film by plasma etching. When, for example, a resist is used as a mask for the plasma etching of the silicon oxide film, it is well known that a gaseous mixture of $C_4F_6$/$O_2$/Ar is employed as an etching gas to improve the selectivity of the silicon oxide film against the resist (For example, see Japanese Patent Laid-open Application No. 2002-100607).

Furthermore, also known for the plasma etching of the silicon oxide film is a method for improving the in-surface uniformity of the plasma etching by changing a mixing ratio of Ar and He, which are used as dilution gases (see, for example, Japanese Patent Laid-open Application No. 2002-252213).

However, as semiconductor devices are getting miniaturized, the diameters of contact holes and the like are also required to be reduced to, for example, not greater than 70 nm. To meet such requirements, it is necessary to replace a conventionally employed KrF resist with an ArF resist. Since, however, plasma resistance of the ArF resist is weak, there has been made an attempt to plasma etch the silicon oxide film by using a hard mask made of, e.g., amorphous carbon. In this case, amorphous carbon is first plasma etched into a predetermined pattern by using the ArF resist as a mask, and plasma etching of the silicon oxide film is then conducted by using the amorphous carbon of the predetermined pattern as a mask.

When plasma etching the silicon oxide film by using the amorphous carbon as a mask, however, a sufficient selectivity of the silicon oxide film against the amorphous carbon (a ratio of an etching rate of the silicon oxide film to an etching rate of the amorphous carbon) cannot be obtained.

As described above, conventionally, when plasma etching the silicon oxide film by using the hard mask made of the amorphous carbon to form a fine pattern, there has been a problem that it is difficult to obtain a sufficient selectivity of silicon oxide film against the amorphous carbon (the ratio of the etching rate of the silicon oxide film to the etching rate of the amorphous carbon).

SUMMARY OF THE INVENTION

It is, therefore, an object of the present invention to provide a plasma etching method and apparatus capable of improving a selectivity of a silicon oxide film against amorphous carbon, and a control program and a computer-readable storage medium storing the control program to be used therefor.

In accordance with a first aspect of the present invention, there is provided a method for performing a plasma etching on a silicon oxide film through an amorphous carbon mask, wherein the plasma etching is performed by using a first etching gas containing a fluorocarbon gas, an oxygen gas, a helium gas and at least one of an argon gas, a krypton gas and a xenon gas.

In the method, the fluorocarbon gas may be $C_4F_6$, $C_4F_8$, or $C_5F_8$.

In the method, a hole may be formed in the silicon oxide film. Preferably, the diameter of the hole is not greater than 70 nm.

In the method, after completing the plasma etching by using the first etching gas, a plasma etching using a second etching gas may be performed, and the second etching gas may be obtained by removing the helium gas from the first etching gas.

The plasma etching using the second etching gas may be an overetching process.

In the method, in the first etching gas, a ratio of a flow rate of the helium gas to a flow rate of at least one of the argon gas, the krypton gas and the xenon gas may be 5 to 50%.

In the method, the amorphous carbon mask may be formed by using a resist exposed to a light beam of which wavelength is shorter than ArF Excimer laser as a mask.

In accordance with a second aspect of the present invention, there is provided an etching apparatus including:

a processing vessel for accommodating an object to be processed therein; an etching gas supply unit for supplying an etching gas into the processing vessel; a plasma generating unit for converting the etching gas into a plasma to thereby plasma etch the object to be processed; and a control unit for controlling the method.

In accordance with a third aspect of the present invention, there is provided a computer-executable control program controlling, when executed, a plasma processing apparatus to perform the method.

In accordance with a fourth aspect of the present invention, there is provided a computer-readable storage medium for storing therein a computer-executable control program, wherein the control program controls a plasma processing apparatus to perform the method.

In accordance with the present invention, a plasma etching method and apparatus capable of improving a selectivity of a silicon oxide film against amorphous carbon, and a control program and a computer-readable storage medium storing the control program to be used therefore can be provided.

BRIEF DESCRIPTION OF THE DRAWING

The above and other objects and features of the present invention will become apparent from the following description of a preferred embodiment given in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
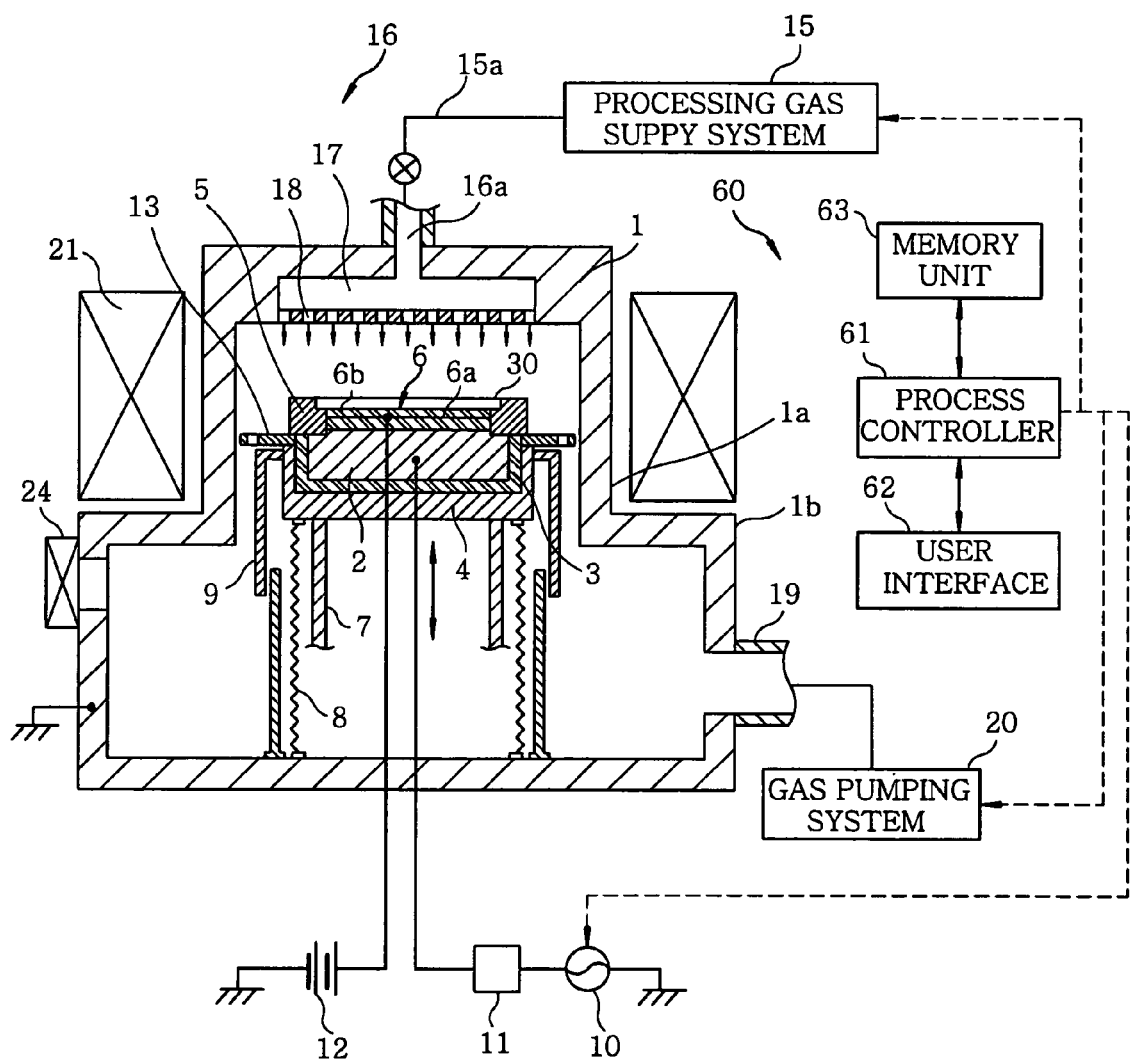
FIG. 1 shows a schematic configuration view of an etching apparatus in accordance with a preferred embodiment of the present invention.
Figure 2A:
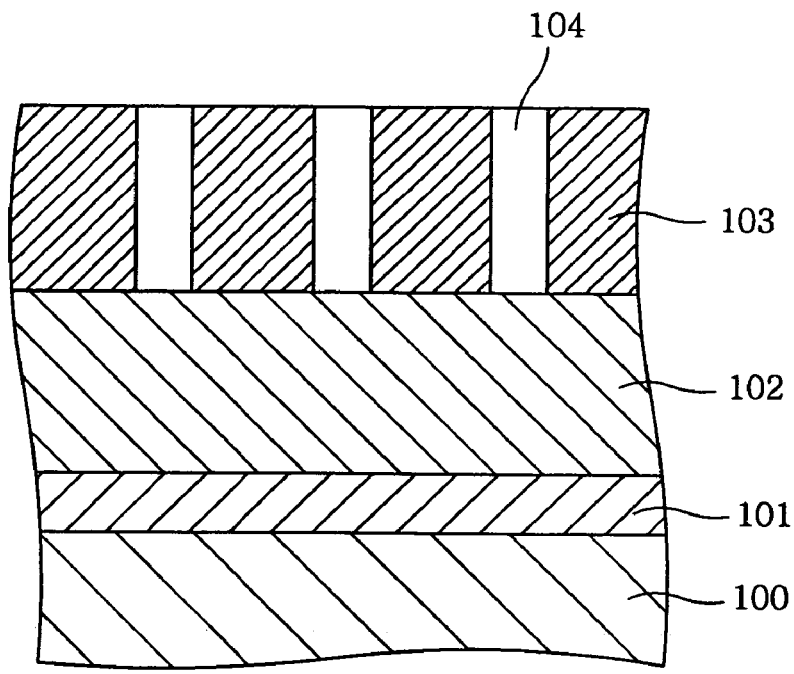
FIGS. 2A and 2B provide cross sectional views of a semiconductor wafer to explain an etching method in accordance with the preferred embodiment of the present invention.
Figure 2B:
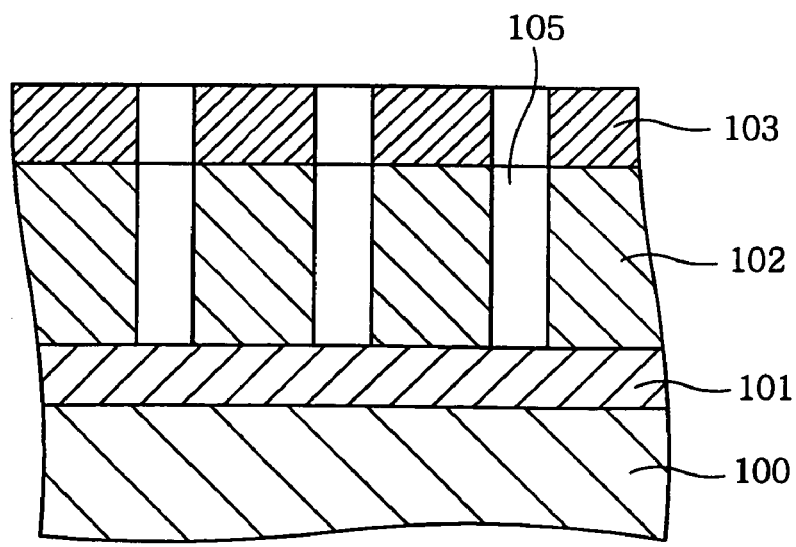

FIG. 1 illustrates a schematic configuration of a plasma etching apparatus in accordance with a preferred embodiment of the present invention. FIGS. 2A and 2B provide enlarged cross sectional views of a semiconductor wafer in accordance with the preferred embodiment of the present invention. Below, the configuration of the plasma etching apparatus will be first explained in connection with FIG. 1.

The plasma etching apparatus includes a hermetically sealed chamber 1 which is electrically grounded. The chamber 1 is configured to have a stepped cylindrical shape with an upper portion 1a of a smaller diameter and a lower portion 1b of a larger diameter. The chamber 1 is formed of, for example, aluminum. Installed in the chamber 1 is a supporting table 2 for horizontally supporting a semiconductor wafer 30 to be processed. The supporting table 2 is formed of, for example, aluminum and is supported by a conductive support 4 via an insulating plate 3. Furthermore, a focus ring 5 formed of, for example, single crystalline silicon is mounted on the periphery of the top surface of the supporting table 2. The supporting table 2 and the support 4 are moved upward and downward by a ball screw mechanism including ball screws 7, and a driving portion below the support 4 is covered with a bellows 8 formed of stainless steel (SUS). Further, a bellows cover 9 is installed to surround the bellows 8.

Further, a RF power supply 10 is connected to the supporting table 2 via a matching box 11 such that a high frequency power of a predetermined frequency (for example, 13.56 MHz) is applied to the supporting table 2 from the RF power supply 10. Meanwhile, disposed above the supporting table 2 to face it in parallel is a shower head 16, which is grounded. Thus, the supporting table 2 and the shower head 16 function as a pair of electrodes.

An electrostatic chuck 6 for electrostatically attracting and holding the semiconductor water 30 thereon is mounted on the top surface of the supporting table 2. The electrostatic chuck 6 has an electrode 6a embedded in an insulator 6b, and the electrode 6a is connected to a DC power supply 12. By applying a voltage to the electrode 6a from the DC power supply 12, the semiconductor wafer 30 is attracted and held by the electrostatic chuck 6 by the help of a Coulomb force.

A coolant path (not shown) is formed within the supporting table 2. By circulating a proper coolant through the coolant path, the semiconductor wafer 30 can be controlled at a desired temperature level. Also, a baffle plate 13 is installed outside the focus ring 5, and the baffle plate 13 is electrically connected to the chamber 1 via the support 4 and the bellows 8.

The shower head 16 is disposed at a ceiling portion of the chamber 1 to face the supporting table 2. The shower head 16 is provided with a plurality of gas discharge openings 18 on its lower surface and has a gas inlet 16a in an upper portion thereof. Further, the shower head 16 has a hollow space 17 formed therein. A gas supply line 15a is connected at one end to the gas inlet 16a, and the other end of the gas supply line 15a is coupled to a processing gas supply system 15 for supplying a processing gas for etching.

The processing gas is introduced into the space 17 of the shower head 16 from the processing gas supply system 15 via the gas supply line 15a and the gas inlet 16a, and is jetted toward the semiconductor wafer 30 through the gas discharge openings 18. In accordance with the preferred embodiment of the present invention, the processing gas supply system 15 is configured to supply an etching gas selectively at least among a gas containing $C_4F_6/O_2/Ar/He$ and a gas containing $C_4F_6/O_2/Ar$.

A gas outlet port 19 is formed in a sidewall of the lower portion 1b of the chamber 1, and a gas pumping system 20 is connected to the gas outlet port 19. By operating a vacuum pump of the gas pumping system 20, the chamber 1 can be depressurized to a predetermined vacuum level. Further, a gate valve 24 for opening and closing a loading/unloading port for the wafer 30 is installed at an upper sidewall of the lower portion 1b of the chamber 1.

Also, a ring magnet 21 is concentrically disposed around the upper portion 1a of the chamber 1 to provide a magnetic field in a space between the supporting table 2 and the shower head 16. The ring magnet 21 is rotated by a rotating unit (not shown) such as a motor.

The whole operation of the plasma etching apparatus having the above-described configuration is controlled by a control unit 60. The control unit 60 includes a process controller 61 with a CPU for controlling each component of the plasma etching apparatus, a user interface 62 and a memory unit 63.

A process manager can operate the plasma etching apparatus by using the user interface 62, wherein the user interface 62 includes a keyboard for inputting a command, a display for showing an operational status of the plasma etching apparatus, and the like.

Moreover, the memory unit 63 stores therein a control program (software) to be used in realizing various processings performed in the plasma etching apparatus under the control of the process controller 61, and/or recipes, each recipe containing processing condition data and the like. When a command is received from the user interface 62, the process controller 61 retrieves a necessary recipe from the memory unit 63 to execute it, so that a desired processing is performed in the plasma processing apparatus under the control of the process controller 61. Further, the control program or the recipe containing processing condition data and the like can be retrieved from a computer-readable storage medium (such as a hard disk, a compact disk, a flexible disk, a semiconductor memory or the like), or retrieved on-line through, for example, a dedicated line from another apparatus available all the time.

Hereinafter, a sequence for plasma etching a silicon oxide film formed on the semiconductor wafer 30, which is performed by the plasma etching apparatus configured as described above, will be described. The gate valve 24 is opened first, and the semiconductor wafer 30 is loaded into the chamber 1 via a load lock chamber (not shown) by a transfer robot (not shown) to be finally mounted on the supporting table 2. Then, the transfer robot is retreated out of the chamber 1, and the gate valve 24 is closed. Subsequently, the supporting table 2 is elevated up to a position illustrated in the figure, and the chamber 1 is evacuated via the gas outlet port 19 by the vacuum pump of the gas pumping system 20.

If the chamber 1 reaches a predetermined vacuum level, a preset processing gas is supplied into the chamber 1 from the processing gas supply system 15. Then, while the internal pressure of the chamber 1 is controlled to be kept at, for example, 6 Pa, a high frequency power of a frequency of, e.g. 13.56 MHz and a power of, e.g., 500 to 5000 W is applied to the supporting table 2 from the RF power supply 10. At this time, by a preset voltage applied to the electrode 6a of the electrostatic chuck 6 from the DC power supply 12, the semiconductor wafer 30 is attracted and held by the electrostatic chuck 6 due to the Coulomb force.

By applying the high frequency power to the supporting table 2 serving as a lower electrode, as described above, an electric field is formed between the shower head 16 serving as an upper electrode and the supporting table 2 serving as the lower electrode. Since a horizontal magnetic field is also formed in the upper portion 1a of the chamber 1 due to the presence of the ring magnet 21, electrons are made to drift, which in turn generates a magnetron discharge in the processing space where the semiconductor wafer 30 is located. Then, a preset film formed on the semiconductor wafer 30 is etched by a plasma of the processing gas generated due to the magnetron discharge.

Then, upon the completion of the predetermined etching process, the supply of the high frequency power and the etching gas is stopped, and the semiconductor wafer 30 is unloaded from the chamber 1 in the reverse sequence as described above.

Below, a plasma etching method in accordance with the preferred embodiment of the present invention will be described with reference to FIGS. 2A and 2B. As shown in FIG. 2A, on the surface of a semiconductor wafer 100 to be processed, a SiN film (serving as an etch stop layer) 101, a silicon oxide film 102 and an amorphous carbon film (serving as a mask) 103 are laminated in that order from the lower side. Formed in the uppermost amorphous carbon film (mask) 103 are openings 104 for forming contact holes of a predetermined diameter. The openings 104 in the amorphous carbon film 103 serving as a hard mask are formed by performing a plasma etching or the like using a resist mask obtained by exposing it, for example, to a light beam of which wavelength is shorter than ArF Excimer laser.

In the plasma etching method in accordance with the preferred embodiment of the present invention, a plasma etching is performed by using the amorphous carbon film 103 as a mask from the state shown in FIG. 2A, so that contact holes 105 are formed in the silicon oxide film 102, as illustrated in FIG. 2B. At this time, by using a gaseous mixture of $C_4F_6/O_2/Ar/He$ as an etching gas, the selectivity of the silicon oxide film against the amorphous carbon film (a ratio of an etching rate of the silicon oxide film to an etching rate of the amorphous carbon film) can be increased.

In a test experiment, contact holes (each having a diameter of 70 nm and a pitch of 150 nm) were formed on a semiconductor wafer having a structure as described in FIG. 2A (wherein the thicknesses of an amorphous carbon film and a silicon oxide film were set to be 180 nm and 1200 nm, respectively) by using the plasma etching apparatus shown in FIG. 1. Further, a processing recipe to be described hereinafter is recorded in the memory unit 63 or a storage medium to be read therefrom and executed by the control unit 60 of the plasma etching apparatus so that an etching process is executed according to the recipe.

The processing recipe is as follows:
etching gas: $C_4F_6/O_2/Ar/He=25/18/700/200$ sccm;
pressure: 6 Pa;
high frequency power: 2000 W;
etching time: 120 seconds (10% overetching).

As a result of conducting the etching process according to the processing recipe specified as above, the selectivity of the silicon oxide film against the amorphous carbon film (the ratio of the etching rate of the silicon oxide film to the etching rate of the amorphous carbon film) was found to be about 21. Further, the thickness of a residual amorphous carbon film was measured to be about 102 nm after the completion of the plasma etching.

Meanwhile, in a comparative experiment, contact holes were formed on a semiconductor wafer having the same structure as illustrated in FIG. 2A according to a recipe as follows:
etching gas: $C_4F_6/O_2/Ar=25/18/900$ sccm;
pressure: 6 Pa;
high frequency power: 1800 W;
etching time: 150 seconds (50% overetching).

As a result, the selectivity of a silicon oxide film against an amorphous carbon film (a ratio of an etching rate of the silicon oxide film to an etching rate of the amorphous carbon) was found to be about 13, and the thickness of a residual amorphous carbon film was measured to be about 30 nm after the plasma etching.

As described above, in the test experiment in accordance with the preferred embodiment of the present invention, the selectivity of the silicon oxide film against the amorphous carbon film (the ratio of the etching rate of the silicon oxide film to the etching rate of the amorphous carbon film) was about 1.6 times as high as that of the comparative experiment. Further, it was also possible to obtain a sufficient thickness of the residual amorphous carbon film, i.e., a thickness of about 102 nm. Here, the flow rate of a He gas added to the processing gas is set to range from 5% to 50% of the flow rate of Ar.

In the above test experiment in accordance with the preferred embodiment of the present invention, it was possible to improve the selectivity of the silicon oxide film against the amorphous carbon film by adding the He gas to the etching gas. However, the result of observing a cross section of a contact hole thus formed showed that the sidewall of the contact hole had a tendency to be tapered. That is, the diameter of a bottom portion of the contact hole (bottom CD) was found to be smaller than the diameter of an uppermost portion of the contact hole (top CD). To be specific, a top CD and a bottom CD were measured to be 95 nm and 44 nm at a central portion of the semiconductor wafer, while they were measured to be 99 nm and 36 nm at a peripheral portion of the semiconductor wafer, respectively.

To solve this problem, it is possible to perform a two-step etching process by changing, during the etching process, the first etching gas of $C_4F_6/O_2/Ar/He$ to a second etching gas containing no He gas, i.e., a gaseous mixture of $C_4F_6/O_2/Ar$. For example, the timing for changing the etching gases can be set up such that only an overetching is conducted by using the gaseous mixture of $C_4F_6/O_2/Ar$.

A second test experiment was conducted, in which contact holes were formed on a semiconductor wafer having the same structure as described in FIG. 2A by performing a plasma etching according to a two-step processing recipe as follow:
(First Step)
etching gas: $C_4F_6/O_2/Ar/He=25/18/700/200$ sccm;
pressure: 6 Pa;
high frequency power: 2000 W;
etching time: 108 seconds (no overetching);
(Second Step)
etching gas: $C_4F_6/O_2/Ar=25/18/900$ sccm;
pressure: 6 Pa;
high frequency power: 1800 W;
etching time: 51 seconds (50% overetching).

In the second experiment, as a result of performing the two-step etching process, tapering tendency of the sidewalls of the contact holes could be suppressed. To be more specific, a top CD and a bottom CD were measured to be about 96 nm and 75 nm at a central portion of the semiconductor wafer, while they were measured to be about 99 nm and 63 nm at a peripheral portion of the semiconductor wafer, respectively. Moreover, the thickness of a residual amorphous carbon film was about 85 nm after the plasma etching. Thus, it was possible to obtain an etching selectivity capable of attaining a sufficient amount of the residual amorphous carbon film.

Further, as a fluorocarbon gas contained in the etching gas, for example, $C_5F_8$, $C_4F_8$ and the like can be employed instead of $C_4F_6$. In addition, the Ar gas can be replaced by another rare gas such as Xe and Kr. Also, other gases, e.g., CO or the like, can be added to the respective etching gases.

While the invention has been shown and described with respect to the preferred embodiment, it will be understood by those skilled in the art that various changes and modifications may be made without departing from the scope of the invention as defined in the following claims.

What is claimed is:

1. A method for performing a plasma etching on a silicon oxide film through an amorphous carbon mask, the method comprising:

performing the plasma etching by using a first etching gas containing a fluorocarbon gas, an oxygen gas, a helium gas and at least one of an argon gas, a krypton gas and a xenon gas, wherein the fluorocarbon gas is $C_4F_6$, $C_4F_8$, or $C_5F_8$, wherein after completing the plasma etching by using the first etching gas, a plasma etching using a second etching gas is performed, and the second etching gas is obtained by removing the helium gas from the first etching gas, wherein the plasma etching using the second etching gas is an overetching process, wherein, in the first etching gas, a ratio of a flow rate of the helium gas to a flow rate of at least one of the argon gas, the krypton gas and the xenon gas is 5 to 50% and the ratio of the etching rate of the silicon oxide to the etching rate of the amorphous carbon mask is about 21.

2. The method of claim 1, wherein a hole is formed in the silicon oxide film.

3. The method of claim 2, wherein the diameter of the hole is not greater than 70 nm.

4. The method of claim 1, wherein the amorphous carbon mask is formed by using a resist exposed to a light beam of which wavelength is shorter than ArF Excimer laser as a mask.

* * * * *